(12) United States Patent
Podlesny et al.

(10) Patent No.: US 6,313,691 B1
(45) Date of Patent: Nov. 6, 2001

(54) METHOD AND APPARATUS FOR ADJUSTING THE STATIC THRESHOLDS OF CMOS CIRCUITS

(75) Inventors: Andrew V. Podlesny; Valery V. Lozovoy; Alexander V. Malshin, all of Moscow (RU)

(73) Assignee: Elbrus International Limited, George Town Grand Cayman (KY)

( * ) Notice: Subject to any disclaimer, the term of this patent is extended or adjusted under 35 U.S.C. 154(b) by 0 days.

(21) Appl. No.: 09/506,670

(22) Filed: Feb. 17, 2000

Related U.S. Application Data

(60) Provisional application No. 60/120,356, filed on Feb. 17, 1999.

(51) Int. Cl.[7] .................................................... H03K 3/01

(52) U.S. Cl. ............................................................ 327/534

(58) Field of Search .................................... 327/534, 535, 327/537, 561, 562, 563, 564, 565, 566

(56) References Cited

U.S. PATENT DOCUMENTS

| 4,791,318 | * | 12/1988 | Lewis et al. | 307/297 |
| 4,948,992 | * | 8/1990 | Bukowski, Jr. | 307/491 |
| 6,147,508 | * | 11/2000 | Beck et al. | 326/32 |

* cited by examiner

Primary Examiner—Jeffrey Zweizig
(74) Attorney, Agent, or Firm—Townsend and Townsend and Crew LLP

(57) ABSTRACT

An apparatus for adjusting static thresholds of CMOS circuits. The apparatus includes a low reference circuit including at least one channel n-channel MOS device having a back gate and a high reference circuit including at least one p-channel MOS device having a back gate. A feedback loop is provided for providing a control voltage to the back gate of the n-channel NMOS device while a second feedback loop is provided for providing a second control voltage to the back gate of the p-channel MOS device. A control voltage is applied to the first feedback loop while a control voltage is applied to the second feedback loop. The output of the low reference circuit is coupled to the first feedback loop and the output of the high reference circuit is coupled to the second feedback loop.

9 Claims, 2 Drawing Sheets

METHOD AND APPARATUS FOR ADJUSTING THE STATIC THRESHOLDS OF CMOS CIRCUITS

This application claims priority from U.S. Provisional Patent Application No. 60/120,356, filed Feb. 17, 1999, the disclosure of which is incorporated herein by reference in its entirety.

BACKGROUND OF THE INVENTION

1. Field of the Invention

The present invention relates to CMOS integrated circuits and, more particularly, to a circuit for establishing a prescribed threshold voltage and for controlling the threshold voltage of one or more CMOS circuits in an integrated circuit to mitigate the effects of process variations, temperature variations, and other factors that may cause the threshold voltage to vary.

2. Description of the Prior Art

CMOS integrated circuits are widely known in the electronics industry. Although "MOS" is an acronym for metal oxide semiconductor, conductive polysilicon gate transistors are now more common than metal gate transistors. As used herein, the acronym "MOS" refers generally to conductor oxide semiconductor devices wherein the gate may be metal, conductive polysilicon, or any other conductor.

The MOS transistors that are utilized in such integrated circuits are characterized by threshold gate-to-source voltage required for the transistor to turn on and to conduct drain current. The threshold voltage is susceptible to manufacturing process variations and temperature variations. In many cases, threshold voltage variations are tolerable. In other cases, however, such threshold voltage variations are detrimental to circuit performance. For example, when the inputs to a MOS integrated circuit must be compatible with TTL logic or some other logic family, threshold voltages must be maintained within the limits of the logic family. It is known that the threshold voltages of all MOS devices on an integrated circuit tend to be matched to track each other, since they are subject to the same temperature variations in the same manufacturing process.

In the past, threshold voltages of MOS circuits have been controlled by relatively complex circuitry. For example, an on-chip variable voltage supply may be utilized since the circuit threshold voltage varies with the supply voltage. Such prior art techniques have not been satisfactory since the circuitry occupies a significant part of the chip area, requires significant current for operation, and tends to be difficult to stabilize.

Another prior art approach involved providing a single feedback loop for PMOS transistors. However, this approach proved to be relatively inefficient.

For proper operation, logic circuits must have sufficient static noise margins for high and low logic levels: $V_{nm,\,l}=V_{th,\,l}-V_{ol}$ and $V_{nm,\,h}=V_{o,\,h}-V_{th,\,h}$. In CMOS output levels: $V_{o,l}=V_{ss}$ and $V_{o,\,h}=V_{dd}$. This is why the values $V_{nm,\,l}$ and $V_{nm,\,h}$ are determined by a switching threshold $V_{th}$ of the static transfer characteristic (at the threshold point $V_{out}=V_{in}=V_{th}$). Switching threshold $V_{th}$ depends not only on the threshold voltages $V_t$ of NMOS and PMOS transistors, but on their effective transconductances and saturation voltages, and on the complexity (the number of simultaneously switched inputs) of the logic circuit. For a power supply $V_{dd}<1V$ switching threshold depends on the subthreshold slope also.

The chip-to-chip process variations of transistor parameters, as well as temperature and supply voltage variation reduce the noise margins.

For the supply voltages $V_{dd}>2V$ the projected values $V_{tn}$ and $V_{tp}$ usually make up 15% to 20% of $V_{dd}$. This ensures proper operation of the logic circuits made of wide libraries of logic elements with regard to the $V_t$ process variations and $V_t$ variation from temperature. The $V_t$ process variations can achieve 0.2V. $V_t$ variations in the temperature range from 0 to 100° C. may increase up to 0.4V.

Under these $V_t$ variations, when $V_{dd}$ decreases to 1V and below, the restrictions of the performance and noise immunity losses require stabilization of the switching thresholds of the logic circuits.

SUMMARY OF THE INVENTION

The present invention provides an apparatus for adjusting static thresholds of CMOS circuits. The apparatus includes a low reference circuit that includes an input, an output and at least one n-channel MOS device having a back gate, and a high reference circuit that includes an input, an output and at least one p-channel MOS device having a back gate. The p-channel device is coupled to the n-channel MOS device in a complementary MOS configuration. The apparatus also includes first feedback structure for providing a first control voltage to the back gate of the n-channel MOS device and second feedback structure for providing a second control voltage to the back gate of the p-channel MOS device. The apparatus also includes structure for applying a low reference voltage to the first feedback structure and structure for applying a high reference voltage to the second feedback structure. The output of the low reference circuit is coupled to the first feedback structure and the output with the high reference circuit is coupled to the second feedback structure.

In accordance with one aspect of the present invention, the first and second feedback structure each include an amplifier, each responsive to the low reference voltage and the high reference voltage, respectively.

In accordance with the further aspect of the present invention, at least one of the amplifiers is an operational amplifier.

In accordance with yet another aspect of the present invention, both amplifiers are operational amplifiers.

In accordance with a further aspect of the present invention, the low reference circuit includes four NOR gates.

In accordance with yet another aspect of the present invention, the high reference circuit includes four NAND gates.

Thus, the present invention provides a circuit that ensures automatic adjustment of circuits switching thresholds $V_{th,\,l}$ and $V_{th,\,h}$ to set values of a high reference voltage and a low reference voltage. With such an arrangement, supply voltage and temperature variation is ensured.

DETAILED DESCRIPTION OF THE PREFERRED EXEMPLARY EMBODIMENTS

The present invention adjusts circuit switching thresholds through variation of the thresholds of NMOS and PMOS transistors by varying their respective substrates' back bias. For such a method, NMOS and PMOS transistors are preferably made on a triple-well process or SOIAS, or any other CMOS process providing the possibility of MOS threshold control by the substrate bias for NMOS and PMOS, separately.

Figure 2:
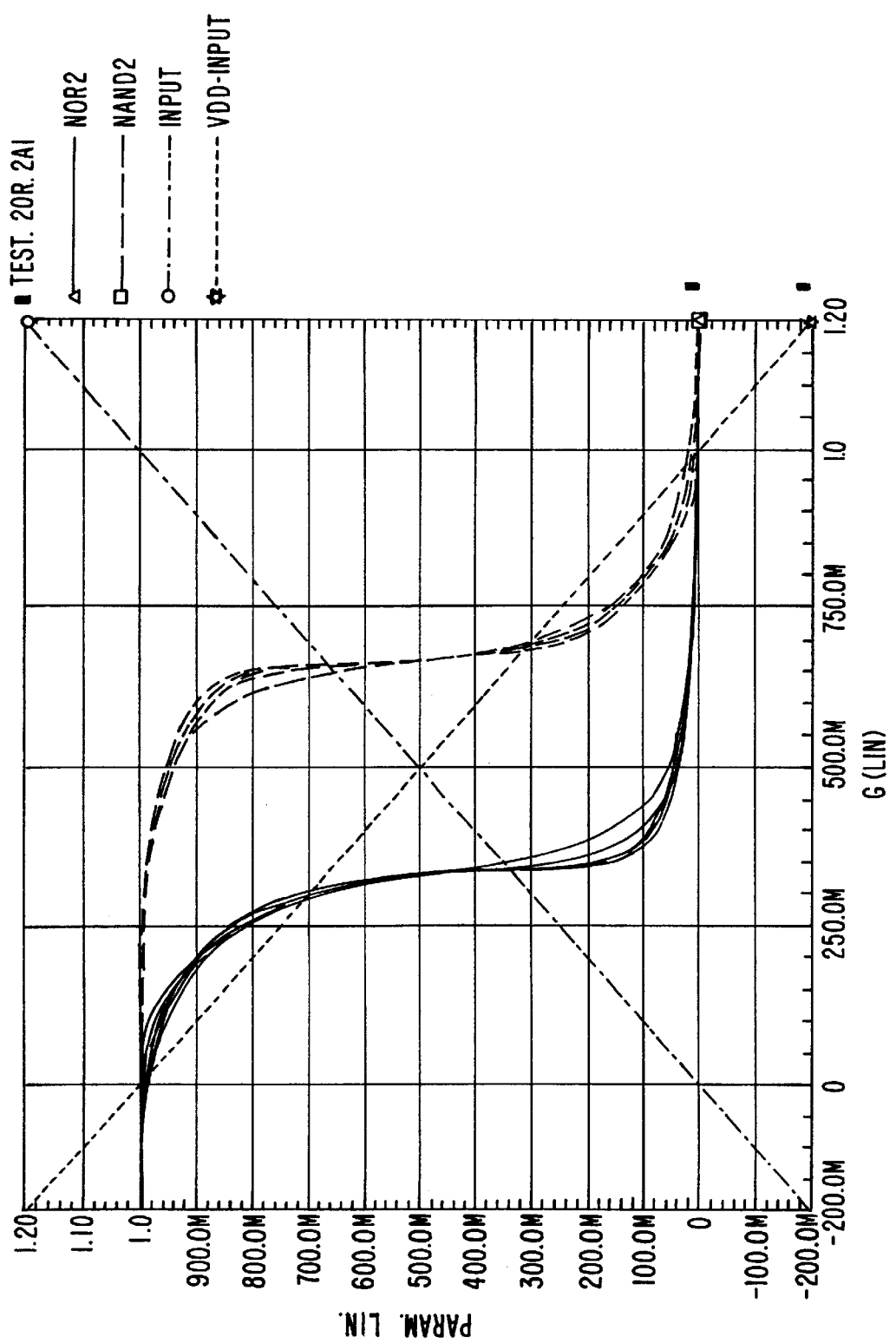
FIG. 2 is a voltage-transfer curve.

Generally, within chip devices, since the thresholds of one type of transistors have a small variation and all transistors are under the same temperature, the adjustment of the logic circuits' switching thresholds may be performed referring to worst circuits that determine noise margins $V_{nm, l}$ and $V_{nm, h}$ within the chip device. The values $V_{nm, l}$ and $V_{nm, h}$ may be approximately determined by the gate threshold voltage $V_{th}$ of the voltage-transfer curve (or static transfer characteristic), which is illustrated in FIG. 2.

Gate threshold voltage $V_{th}$ depends not only on the parameters of the NMOS and PMOS transistors, but also on the type of the circuit and the number of simultaneously switched inputs.

Generally, two circuits should be taken as reference circuits whose switching thresholds are being adjusted: One with minimum low and one with maximum high switching threshold $-V_{th, l}$ and $V_{th, h}$ (for example, for gate library n-NOR/m-NAND with m, n=1 ... 4, these are respectively, 4 NOR and 4 NAND gates, which are switched simultaneously at all inputs). The switching thresholds of the other logic circuits on the chip device, which transistors have the same values $V_{tn}$ and $V_{tp}$ and the same geometrical dimensions, will be between the switching thresholds of these gates: $V_{th}$, NOR and $V_{th}$, NAND.

Figure 1:
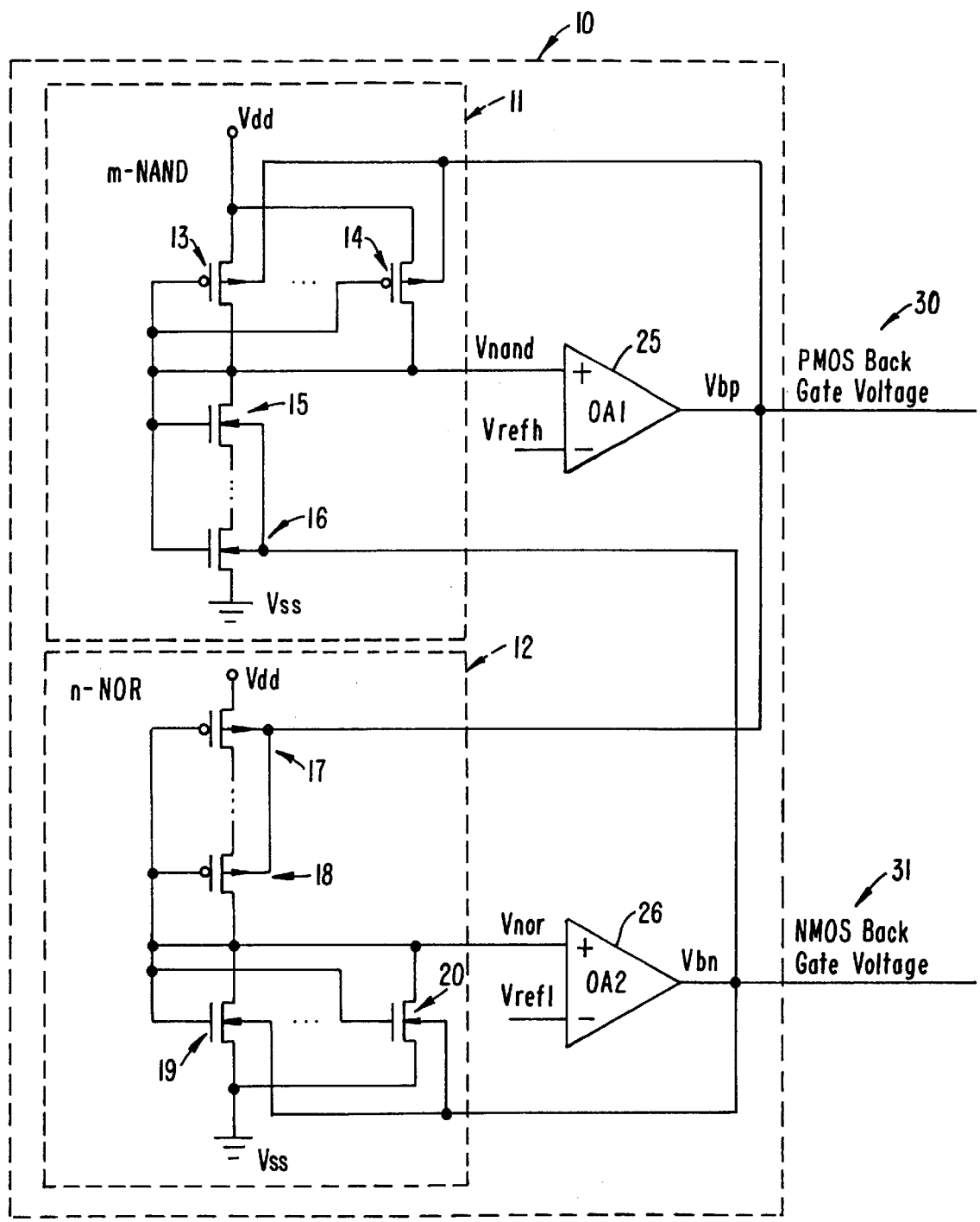
FIG. 1 is a schematic illustration of a threshold adjustment circuit in accordance with the present invention.

With reference to FIG. 1, a threshold voltage adjusting circuit 10 in accordance with the present invention is illustrated. The circuit includes a m-NAND reference gate 11 and a n-NOR reference gate 12. The m-NAND gate includes two p-channel transistors 13, 14 and two n-channel transistors 15, 16 while the n-NOR reference gate includes two p-channel transistors 17, 18 and two n-channel transistors 19, 20.

As can be seen, the outputs of each reference gate are coupled with all inputs of the same gate forming well-known voltage generators with 100% negative feedback. The steady-state output voltage of this circuit, $V_{out}$, is equal to the threshold voltage $V_{th}$ for the respective reference gate ($V_{out}=V_{in}=V_{th}$).

Output voltages $V_{NAND}=V_{th}$ (m-NAND) and $V_{NOR}=V_{th}$ (n-NOR) of the reference gates m-NAND and n-NOR are applied, respectively, to the positive inputs of amplifiers 25, 26. Preferably, the amplifiers are operational amplifiers.

Reference voltages $V_{ref, h}$ and $V_{ref, l}$ which are equal to the required maximum and minimum threshold voltages, are applied, respectively, to the negative inputs of amplifiers 25, 26.

The output PMOS back gate voltage Vbp 30 and NMOS back gate voltage Vbn 31 of the operational amplifiers are applied to the substrates of the PMOS and NMOS of the reference gates, respectively, as well as to substrates of corresponding transistors of all the chip circuits on the chip device.

As a result, a system with complex coupled feedback loops is formed, in which two control signals $V_{bp}$ and $V_{bn}$ tend to eliminate two differences: ($V_{NAND}-V_{ref, h}$ and $V_{ref, l}$) by varying thresholds of NMOS and PMOS transistors.

Thus, the circuit provides three kinds of feedback loops. Firstly, there are two direct negative feedback loops from operational amplifier 25 output through PMOS substrates of the NAND gate and the output of this reference gate back to the input of operational amplifier 25, and from operational amplifier 26 output through NMOS substrates of the NOR gate and the output of this gate back to the input of operational amplifier 26. Second, there are two cross-coupled positive feedback loops: one from the output of operational amplifier 25 through PMOS substrates of the NOR gate, the output of this reference gate, amplifier 26, NMOS substrates of the NAND gate and the output of this reference gate back to the input of amplifier 25, and from the output of operational amplifier 26 through NMOS substrates of the NAND gate, the output of the reference gate, amplifier 25, PMOS substrates of the NOR gate, and the output of this reference gate back to the input of amplifier 26. Third, two local 100% negative feedback loops from the outputs to all inputs of the NAND gate and from the outputs to all inputs of the NOR gate.

Thus, the present invention provides an apparatus wherein the thresholds of both PMOS transistors and NMOS transistors are simultaneously adjusted. Furthermore, the present invention utilizes a "double" feedback loop, thus improving its efficiency. The present invention ensures that the required noise margin for sets of CMOS gates is met.

The extreme transfer curves determining the noise immunity margin for discussed options of CMOS circuit implementation with the same relative noise immunity margin are given in FIG. 2. Threshold voltage control circuits automatically adjust threshold values according to the extreme static curves for the whole range of supply voltages Vdd= 0.15V–2.0V at a rated temperature.

The following includes an analysis illustrating the inventive method's correctness and the stability of the invention's circuit according to one embodiment.

Analysis of the Method Correctness

Using the classic nonlinear Schichman-Hodges MOS model one can get explicit expressions for a threshold voltages Vth CMOS M-NAND and N-NOR gates as a function of power supply voltage Vd and P-,N-MOS parameters: thresholds Vtp, Vtn and device transconductances Bp,Bn:

$$Vth,na=(Vd+Vtn*sqrt(Bn/Bp)/M-Vtp)/(1+sqrt(Bn/Bp)/M), \quad (1.1)$$

$$Vth,no=(Vd+Vtn*sqrt(Bn/Bp)*N-Vtp)/(1+sqrt(Bn/Bp)*N); \quad (1.2)$$

where the Bn and Bp are:

$$Bp=Kp*Wp/Lp, \quad (2.1)$$

$$Bn=Kn*Wn/Ln. \quad (2.2)$$

In (1) MOS thresholds Vtp and Vth are a functions of substrates back bias Vb:

$$Vtn=Vtno+GAMMAN*sqrt(2*phi+|Vbn|), \quad (3.1)$$

$$Vtp=Vtpo+GAMMAP*sqrt(2*phi+Vbp). \quad (3.2)$$

In (1) and (3) PMOS threshold Vtp is a module of an actual negative threshold.

Expressions (1) form the system of two linear algebraic equations relative to Vtn and Vtp:

$$Vtn*B/M-Vtp=Vth,na*(1+B/M)-Vd, \quad (4.1)$$

$$Vtn*B*N-Vtp=Vth,no*(1+B*N)-Vd. \quad (4.2)$$

In (4) B=sqrt(Bn/Bp) for simplicity.

The system (4) is compatible and has the only solution if the determinant of the system (DET) is not equal to zero.

From (4):

$$DET = \begin{vmatrix} B/M-1 & \\ & \\ & B*N-1 \end{vmatrix} = B*(M*N-1)/M. \quad (5)$$

From (5) it follows that the system (4) has the only solution if M*N non equal to one. Actually M>=1 and N>=1, and above condition is executed if M*N>1 i.e. if the logic cells library is not reduced to the only inverter cell (for the "library" which consists of the only one inverter: M=N=1). Then from (4) and (5) with some algebra the steady-state (ss) solution is:

$$Vtn,ss(Vth,no*(1+B*N)-Vth,na*(1+B/M))/(B*(M*N-1)/M], \quad (6.1)$$

$$Vtp,ss=((Vth,na*(1+B/M)-Vd)*N-(Vth,no*(1+B*N)-Vd)/M)/((M*N-1)/M). \quad (6.2)$$

It should be noted that as two reference gates one can take not only different-function-type gates (for example, gates 2-NAND and 2-NOR) but also one-function-type gates (for example, gates 2-NAND and 4-NAND which are switched simultaneously by all inputs) as well as two one-type multiinputs gates (for example two gates 2-NAND: the first is switched by one input and the second is switched by both inputs simultaneously).

For these cases the initial expressions (1) should be correspond to particular two gates; still the analysis and results are the same: the proposed method is a correct if both reference gates are not degraded to fully identical circuits.

Analysis of the Circuit Stability

The analysis of the circuit stability in closed form can be executed using the Laplace transform and criteria of dynamic stability after the circuit model linearization in the vicinity of the steady-state solution: Vth,na(ss)=Vrefh and Vth,no(ss)=Vrefl.

Take following assumptions.

Model of the differential amplifier has a gain with one-pole approximation: Ku{s}=Ku/(1+s*Tu) and d-c gain equal Ku. With this model Laplace transforms for both OA2 and OA1 amplifiers on FIG. 1 (OA2 and OA1 are identical) are:

$$Vbp\{s\}=(Vna\{s\}-Vrefh)*Ku/(1+s*Tu), \quad (7.1)$$

$$Vbn\{s\}=(Vno\{s\}-Vrefl)*Ku/(1+s*Tu). \quad (7.2)$$

Model of reference CMOS gate consists of the differential amplifiers, which amplify the difference between the input signal Vin and switching threshold Vth and the Vth generator. The gate gain has one-pole approximation Kg{s}=Kg/(1+s*Tg) too.

Laplace transforms for reference gates NAND and NOR in FIG. 1 are:

$$Vna\{s\}=Vrefh+(Vth,na\{s\}-Vna\{s\})*Kg/(1+s*Tg), \quad (8.1)$$

$$Vno\{s\}=Vrefl+(Vth,no\{s\}-Vno\{s\})*Kg/(1+s*Tg). \quad (8.2)$$

In (8) gates switching thresholds Vth,na and Vth,no are a Laplace transforms for expressions (1):

$$Vth,na\{s\}=Ao*Vd+An*Vtn\{s\}+Ap*Vtp\{s\}, \quad (9.1)$$

$$Vth,no\{s\}=Bo*Vd+Bn*Vtn\{s\}+Bp*Vtp\{s\}, \quad (9.2)$$

where factors Ai and Bi are frequency independent:

$$Ao=1/(1+B/M), An=(B/M)/(1+B/M), Ap=-1/(1+B/M);$$

$$Bo=1/(1+B/N), Bn=(B*N)/(1+B*N), Bp=-1/(1+B*N);$$

and as above noted: B=sqrt(Bn/Bp).

In (9) MOS thresholds dependences on substrates back bias Vb (3) are linearized in the vicinity of operation point too and described by Laplace transforms:

$$Vtn\{s\}=Vtn,ss-Gn*Vbn\{s\}, \quad (10.1)$$

$$Vtp\{s\}=Vtp,ss+Gp*Vbp\{s\}. \quad (10.2)$$

After substitutions of the expressions (8–10) in (7) one gets the Laplace transform for the 2-nd order system of linear ordinary differential equations relative to Vtn and Vtp:

$$Vtp\{s\}-Vtp,ss=Kp\{s\}*(Ao*Vd+Ap*Vtp\{s\}+An*Vtn\{s\}-Vrefh), \quad (11.1)$$

$$Vtn,ss-Vtn\{s\}=Kn\{s\}*(Bo*Vd+Bp*Vtp\{s\}+Bn*Vtn\{s\}-Vrefl). \quad (11.2)$$

where Kp{s} and Kn{s} are a loop gains:

$$Kp\{s\}=Gp*Ku\{s\}*Kg\{s\}/(1+Kg\{s\}), \quad (12.1)$$

$$Kp\{s\}=Gn*Ku\{s\}*Kg\{s\}/(1+Kg\{s\}). \quad (12.2)$$

In order to analyze the system transient response let us assume that amplifiers OA2 and OA1 have a dominating poles (Tg<<Tu) and thus in (11) a gates gains are frequency independent: Kg{s}=Kg. After these assumptions, rewrite the system (11) in a classic form:

$$Vtn\{s\}*An'+Vtp\{s\}*(Ap'-1-s*Tu)=Vreth-Vtp,ss*(1+s*Tu)-Ao(1\cdot Vd)$$

$$Vtn\{s\}*(Bn'+1+s*Tu)+Vtp\{s\}*Bp'=Vrefl+Vtn,ss*(1+s*Tu)-Bo(1\cdot Vd2)$$

where:

$$Ai'=Ai*Gp*Ku*Kg/(1+Kg), Bi'=Bi*Gn*Ku*Kg/(1+Kg).$$

From classic analysis it is known that similar systems are dynamically stable, if roots of the characteristic equation have the negative real parts.

The characteristic equation of system (13) is 2nd order polynomial:

$$P\{s\}=C0*(s*Tu)^2+C1*(s*Tu)+C2 \quad (14)$$

with factors:

$$C0=1,$$

$$C1=(Bn'+1)-(Ap'-1),$$

$$C2=An'*Bp'-(Bn'+1)*(Ap'-1).$$

Roots S1,S2 of the characteristic equation (13) are:

$$S1,S2=[-(C1/2)+-sqrt((C1/2)^2-C2)]/T; \quad (15)$$

and ones have negative real parts, if factors C1 and C2 are positive. From previous expressions (7–14):

$$C1 = (1/T)*[Gn*K*N*B/(1 + B*N) + Gp*K/(1 +B/M) + 2]; \quad (16.1)$$

$$C2 = (1/T^2)*\{Gn*Gp*K^2*(N-1/M)*B/(1+B/M)(1+B*N) + \\ + GN*K*B*N/(1+B*N) + \\ + Gp*K/(1+B/M) + \\ + 1\};$$

(16.2)

where $K=Ku*Kg/(1+Kg)$.

The factor C1 is always positive. If static loops gains $Gn*K\gg 1$ and $Gp*K\gg 1$ (this is needed to provide the small static error in the system) one can neglect the last three terms in (16.2). In this case the factor C2 is positive, if $M*N>1$.

It is interesting that the circuit static correctness and the circuit dynamic stability conditions are the same:

$$M*N>1,$$ (17)

and for the nondegraded cells library the simultaneous two-gates thresholds adjusting is always possible and stable under any conditions.

Although the invention has been described with reference to specific exemplary embodiments, it will be appreciated that it is intended to cover all modifications and equivalents within the scope of the appended claims.

What is claimed is:

1. Apparatus for adjusting static thresholds of CMOS circuits, the apparatus comprising:
    a low reference circuit comprising an input, an output and at least one n-channel MOS device having a back gate;
    a high reference circuit comprising an input, an output and at least one p-channel MOS device having a back gate, the p-channel MOS device being coupled to the n-channel MOS device in a complementary MOS configuration;
    first feedback means for providing a first control voltage to the back gate of the n-channel MOS device;
    second feedback means for providing a second control voltage to the back gate of the p-channel MOS device;
    means for applying the first control voltage to the first feedback means; and
    means for applying the second control voltage to the second feedback means;
    wherein the output of the low reference circuit is coupled to the first feedback means and the output of the high reference circuit is coupled to the second feedback means.

2. Apparatus in accordance with claim 1 wherein the first and second feedback means each comprises amplifier means, each responsive to the low reference voltage and the high reference voltage, respectively.

3. Apparatus in accordance with claim 2 wherein at least one of the amplifier means comprises an operational amplifier.

4. Apparatus in accordance with claim 3 wherein both amplifier means comprises an operational amplifier.

5. Apparatus in accordance with claim 1 wherein the low reference circuit comprises a NOR gate with four transistors.

6. Apparatus in accordance with claim 1 wherein the high reference circuit comprises a NAND gate with four transistors.

7. Apparatus in accordance with claim 1 wherein the low reference circuit comprises a NOR gate having a number of inputs that is equal to the maximum number of NOR gates of the circuits.

8. Apparatus in accordance with claim 1 wherein the high reference circuit comprises a NAND gate having a number of inputs that is equal to the maximum number of NAND gates of the circuits.

9. A method of adjusting static thresholds of CMOS circuits, the method comprising:
    providing a low reference circuit comprising at least one n-channel MOS device having a back gate;
    providing a high reference circuit comprising at least one p-channel MOS device having a back gate, the p-channel MOS device being coupled to the n-channel MOS device in a complementary MOS configuration;
    determining a low reference voltage;
    determining a high reference voltage;
    providing the low reference voltage to a first amplifier;
    providing the high reference voltage to a second amplifier;
    generating a first control voltage with the first amplifier;
    generating a second control voltage with the second amplifier;
    providing the first control voltage to the back gate of the n-channel MOS device; and
    providing the second control voltage to the back gate of the p-channel MOS device.

* * * * *